United States Patent
Zeng

(10) Patent No.: US 10,387,255 B2
(45) Date of Patent: Aug. 20, 2019

(54) DATA RECONSTRUCTION METHOD IN DISTRIBUTED STORAGE SYSTEM, APPARATUS, AND SYSTEM

(71) Applicant: Huawei Technologies Co., Ltd., Shenzhen (CN)

(72) Inventor: Yongqiang Zeng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 214 days.

(21) Appl. No.: 15/475,303

(22) Filed: Mar. 31, 2017

(65) Prior Publication Data

US 2017/0206135 A1 Jul. 20, 2017

Related U.S. Application Data

(63) Continuation of application No. PCT/CN2015/100078, filed on Dec. 31, 2015.

(51) Int. Cl.
*G06F 11/10* (2006.01)
*G06F 3/06* (2006.01)
(Continued)

(52) U.S. Cl.
CPC .......... *G06F 11/1088* (2013.01); *G06F 3/064* (2013.01); *G06F 3/067* (2013.01);
(Continued)

(58) Field of Classification Search
CPC .............. G06F 11/1088; G06F 3/0619
See application file for complete search history.

(56) References Cited

U.S. PATENT DOCUMENTS 8,706,701 B1 * 4/2014 Stefanov ........... G06F 17/30197
707/687
8,904,229 B1 * 12/2014 Veeraswamy ....... G06F 11/1088
714/6.2
(Continued)

FOREIGN PATENT DOCUMENTS

CN 103729352 A 4/2014
CN 104580324 A 4/2015
(Continued)

OTHER PUBLICATIONS

Machine Translation and Abstract of Chinese Publication No. CN103729352, Apr. 16, 2014, 12 pages.
(Continued)

*Primary Examiner* — Yolanda L Wilson
(74) *Attorney, Agent, or Firm* — Conley Rose, P.C.

(57) ABSTRACT

A data reconstruction method is performed in a distributed storage system. A primary storage node in the distributed storage system performs EC encoding on to-be-written data to generate an EC stripe, and stores, on each storage node, each EC block in the EC stripe. When a fault occurs on some storage nodes and causes a write failure of EC blocks, the primary storage node locally stores an EC block allocated to a storage node to which the write fails and generates metadata information required for data reconstruction. After the storage node recovers from the fault, the primary storage node sends, to the storage node, the stored EC block allocated to the storage node to which the write fails and the metadata information corresponding to the EC block, so that the storage node that recovers from the fault completes the data reconstruction.

18 Claims, 6 Drawing Sheets

(51) Int. Cl.
*G06F 11/20* (2006.01)
*H03M 13/15* (2006.01)
(52) U.S. Cl.
CPC .......... *G06F 3/0619* (2013.01); *G06F 3/0647* (2013.01); *G06F 11/2094* (2013.01); *H03M 13/154* (2013.01); *H03M 13/1515* (2013.01)

(56) References Cited

U.S. PATENT DOCUMENTS

| | | | | |
|---|---|---|---|---|
| 9,201,735 | B1* | 12/2015 | Rakitzis | G06F 9/48 |
| 9,690,659 | B2* | 6/2017 | Miyamae | G06F 11/1096 |
| 2011/0296104 | A1* | 12/2011 | Noda | G06F 11/1084 |
| | | | | 711/114 |
| 2012/0011398 | A1* | 1/2012 | Eckhardt | G06F 11/2028 |
| | | | | 714/15 |
| 2012/0243683 | A1* | 9/2012 | Oba | H04L 9/0836 |
| | | | | 380/255 |
| 2012/0297154 | A1* | 11/2012 | Dematapitiya | G06F 11/1092 |
| | | | | 711/156 |
| 2015/0220398 | A1* | 8/2015 | Schirripa | G06F 11/1469 |
| | | | | 707/675 |
| 2015/0355974 | A1* | 12/2015 | Hayes | G06F 11/1076 |
| | | | | 714/15 |
| 2016/0011935 | A1* | 1/2016 | Luby | G06F 3/0617 |
| | | | | 714/6.2 |
| 2016/0357634 | A1* | 12/2016 | Wang | G06F 3/0617 |
| 2017/0255522 | A1* | 9/2017 | Wang | G06F 3/0617 |

FOREIGN PATENT DOCUMENTS

| | | |
|---|---|---|
| CN | 105095013 A | 11/2015 |
| WO | 2009049023 A2 | 4/2009 |

OTHER PUBLICATIONS

Machine Translation and Abstract of Chinese Publication No. CN104580324, Apr. 29, 2015, 14 pages.
Foreign Communication From a Counterpart Application, PCT Application No. PCT/CN2015/100078, English Translation of International Search Report dated Aug. 19, 2016, 2 pages.
Foreign Communication From a Counterpart Application, European Application No. 15903767.0, Extended European Search Report dated Dec. 19, 2017, 9 pages.

* cited by examiner

DATA RECONSTRUCTION METHOD IN DISTRIBUTED STORAGE SYSTEM, APPARATUS, AND SYSTEM

CROSS-REFERENCE TO RELATED APPLICATIONS

This application is a continuation of International Application No. PCT/CN2015/100078, filed on Dec. 31, 2015, the disclosure of which is hereby incorporated by reference in its entirety.

TECHNICAL FIELD

The present disclosure relates to the field of Information Technology (IT), and in particular, to a data reconstruction method in a distributed storage system, an apparatus, and a system.

BACKGROUND

To ensure data security in a storage system, a multi-copy storage technology is generally used to implement data redundancy backup. With the multi-copy storage technology, multiple same copies of data are stored, and when a piece of data is lost, the lost data can be restored using data in another copy, so as to reduce a data loss probability. A rise in a quantity of copies greatly increases consumption of system storage space and network bandwidth, resulting in an increase of data storage costs. If there are two copies, space actually available for a user is 50% of total storage space of an entire system. If there are three copies, space actually available for the user is only 33%.

Because of a waste of storage space in using the multi-copy storage technology, a current distributed storage system increasingly uses an erasure code (EC) technology to store data. Currently, Reed-Solomon erasure code is widely applied in the storage field. A specific principle of the Reed-Solomon erasure code is data is divided into m data blocks, check encoding is performed on the m data blocks using a redundancy algorithm, multiplication is performed on an encoding matrix and the m data blocks to generate k check blocks, and the m data blocks and the k check blocks constitute an EC stripe. Because a matrix operation is reversible, when k or less blocks of the m+k blocks in the EC stripe are lost, data in the lost blocks can be restored.

Compared with the multi-copy storage technology, the erasure code coding technology undoubtedly improves storage space utilization greatly. However, introduction of an extra encoding and decoding operation has an additional requirement for a computation capability of a distributed storage system.

SUMMARY

This application describes a data reconstruction method in a distributed storage system, an apparatus, and a system, so as to reconstruct data on a faulty node after the faulty node recovers, with no need to restore the data by means of EC decoding, thereby reducing consumption of computation resources and network resources.

According to an aspect, an embodiment of the present disclosure provides a data reconstruction method in a distributed storage system, including obtaining, by a first storage node, to-be-written data, determining a key value of the to-be-written data, updating a version number corresponding to the key value, and performing EC encoding on the to-be-written data to generate an EC stripe, where the EC stripe includes m+k EC blocks, the m EC blocks are data blocks, the k EC blocks are check blocks, m is a positive integer greater than or equal to 2, and k is a natural number; querying, by the first storage node, a partition view and determining a second storage node corresponding to a partition to which the to-be-written data belongs, where the first storage node is a primary storage node corresponding to the partition, and the second storage node is a secondary storage node corresponding to the partition; sending, by the first storage node, a write request to the second storage node, where the write request carries an identifier (ID) of the partition to which the to-be-written data belongs, the key value and the version number of the to-be-written data, and data, an in-block data offset, and an in-block data length of an EC block allocated to the second storage node; when determining that writing to the second storage node fails, storing, by the first storage node, the data of the EC block allocated to the second storage node, and generating metadata information corresponding to the EC block allocated to the second storage node, where the metadata information includes the partition ID of the partition to which the to-be-written data belongs, the key value and the version number of the to-be-written data, and the in-block data offset and the in-block data length of the EC block allocated to the second storage node; and after the second storage node recovers from a fault, sending, by the first storage node to the second storage node, the stored data of the EC block allocated to the second storage node and the metadata information, so that the second storage node performs data reconstruction.

A primary storage node in the distributed storage system performs EC encoding on to-be-written data to generate an EC stripe, and stores, on each storage node, each EC block in the EC stripe. When a fault occurs on some storage nodes and causes a write failure of EC blocks, the primary storage node locally stores an EC block allocated to a storage node to which the write fails and generates metadata information required for data reconstruction. After the storage node recovers from the fault, the primary storage node sends, to the storage node, the stored EC block allocated to the storage node to which the write fails and the metadata information corresponding to the EC block, so that the storage node that recovers from the fault completes the data reconstruction. According to the data reconstruction solution in the distributed storage system provided in this application, when some storage nodes are faulty, there is no need to perform EC decoding to restore data on the faulty nodes. Instead, the primary storage node temporarily stores EC blocks allocated to the faulty nodes and sends, after the faulty nodes recover, the temporarily stored EC blocks to the faulty nodes for data reconstruction. According to the foregoing solution, consumption of computation resources that results from EC decoding is avoided when a storage node recovers from a fault and performs data reconstruction, and consumption of network resources that results from a large quantity of data transfer is also avoided when EC decoding is performed. For example, when EC encoding is 4+2, four copies of data are needed for restoring one copy of data. However, in this application, the primary storage node re-sends one copy of data to the faulty node after the faulty node recovers, obviously reducing consumption of network resources. Further, in the distributed storage system, a probability of losing one copy of data is far greater than that of losing two copies of data, and when one copy of data is lost, original data can still be restored. Therefore, EC decoding does not need to be immediately performed to restore the lost data, and after the faulty node recovers, using the data reconstruction solution provided in this application can synchronize the data on the faulty node with that on the other storage nodes.

In a possible implementation manner, the key value of the to-be-written data is used to represent an address range of a logical volume that stores the to-be-written data.

In a possible implementation manner, the key value of the to-be-written data includes a volume identifier of the logical volume that stores the to-be-written data and a data offset identifier. The data offset identifier represents an address range, of the to-be-written data, in the logical volume.

In a possible implementation manner, a storage client determines the key value of the to-be-written data according to the volume identifier of the logical volume that stores the to-be-written data and the data offset identifier. The data offset identifier represents the address range, of the to-be-written data, in the logical volume. A character string obtained after combining the volume identifier of the logical volume and the data offset identifier may be used as the key value of the to-be-written data. The key value of the to-be-written data may be used to uniquely identify an address range within which the to-be-written data is stored.

In a possible implementation manner, the storage client calculates a hash value corresponding to the key value of the to-be-written data using a consistent hashing algorithm, and determines a partition ID of a partition to which the hash value belongs. When determining that the primary storage node corresponding to the partition is the first storage node, the storage client sends the write request to the first storage node. The write request carries the to-be-written data, the key value, the partition ID, and the data offset and the data length of the to-be-written data.

In a possible implementation manner, the partition view includes the partition ID, an identifier of the primary storage node, and an identifier of a secondary storage node. The partition view is maintained and distributed to each storage node by a partition view management module. To-be-written data can be written to each partition in a balanced manner as much as possible by means of centralized partition view management, and the partitions are evenly distributed on the storage nodes in the distributed storage system as much as possible, so as to implement data redundancy backup.

In a possible implementation manner, the first storage node receives a faulty node notification message sent by the partition view management module, where the faulty node notification message carries an identifier of the second storage node; and determines that writing to the second storage node fails. It should be noted that when receiving a write failure response returned by a secondary storage node and determining that writing to the secondary storage node fails, the first storage node does not necessarily think that writing to the secondary storage node inevitably fails. Data sent to the secondary storage node may be lost; in this case, the first storage node sends the write request to the secondary storage node again, and the secondary storage node re-attempts to write an EC block. Therefore, preferably, the faulty node notification message sent by the partition view management module is used as a criterion for determining that writing to a storage node fails.

After the second storage node recovers from a fault, the second storage node requests a latest partition view from the partition view management module, determines a primary storage node corresponding to a partition stored on the second storage node, and requests the primary storage node corresponding to the partition to perform data synchronization. There may be multiple partitions on a faulty node, and a primary storage node in each partition may be different. Therefore, for different partitions, the faulty node needs to request different primary storage nodes to perform data synchronization.

The first storage node receives a data synchronization request sent by the second storage node, where the data synchronization request carries the partition ID. The first storage node obtains, from the second storage node, a key value corresponding to the partition ID and a version number of the key value that are recorded on the second storage node. The first storage node compares a key value corresponding to the partition ID and a version number of the key value that are recorded on the first storage node, with the key value corresponding to the partition ID and the version number of the key value that are obtained from the second storage node, and determines, according to a comparison result, that data reconstruction needs to be performed. The first storage node sends, according to the metadata information, stored data, of an EC block corresponding to the key value, for which data reconstruction is needed and metadata information of the EC block, to the second storage node for data reconstruction.

When receiving the data synchronization request from the second storage node, the first storage node performs a comparison operation and determines that data corresponding to which key value needs to be synchronized. The comparison includes at least one of the following. When the version number corresponding to the key value recorded on the first storage node is the same as the version number corresponding to the key value obtained from the second storage node, skipping performing data reconstruction; when the key value recorded on the first storage node does not include the key value obtained from the second storage node, instructing the second storage node to delete data corresponding to the key value that is not included in the first storage node; when the version number corresponding to the key value recorded on the first storage node is greater than the version number corresponding to the key value obtained from the second storage node, performing a data reconstruction operation; or when the key value recorded on the first storage node is not included in the key value obtained from the second storage node, instructing the second storage node to reconstruct the data corresponding to the key value that is not included in the second storage node.

In a possible implementation manner, when the second storage node receives the EC block temporarily stored in the first storage node and the corresponding metadata information after recovering from the fault, the second storage node writes the data of the EC block onto a disk according to the in-block data offset and the in-block data length of the EC block allocated to the second storage node, and updates the version number corresponding to the key value of the to-be-written data, so as to complete data reconstruction of the EC block.

In a possible implementation manner, in this application, a storage address of the logical volume is equally divided at a granularity of the m EC blocks, to obtain multiple storage units, and data offset identifiers are allocated to the multiple storage units. Further, a storage client receives a storage instruction sent by an upper-layer application, where the storage instruction carries to-be-stored data, and a volume identifier, a data offset, and a data length of the logical volume that stores the to-be-stored data. The storage client determines at least one storage unit corresponding to an address range within which the to-be-stored data is stored, and uses some to-be-stored data corresponding to each storage unit as the to-be-written data that needs to be written to the distributed storage system in one write operation.

When data to be stored at a time is relatively large, the to-be-stored data may need to be divided into multiple sections to be written to the distributed storage system in several times. In this application, a method for writing to-be-stored data by segment is provided. Data written at a time is referred to as the to-be-written data.

Still further, the first storage node calculates a hash value corresponding to the key value of the to-be-written data using a consistent hashing algorithm, and determines a partition ID of a partition to which the hash value belongs. Data is evenly distributed in each partition in a consistent hashing manner.

In a possible implementation manner, after receiving the write failure response, the first storage node may determine that a storage node that sends the write failure response is faulty. Alternatively, the first storage node may determine a faulty node according to status information of a storage node recorded in the partition view.

In a possible implementation manner, in this application, a method for temporarily storing, by the first storage node, an EC block allocated to a faulty node to which writing fails is further provided. The first storage node allocates free storage space as a log volume, to store an EC block allocated to a storage node to which writing fails. The log volume includes at least one log block, and a size of the log block is the same as a size of the EC block.

The size of the log block is set to be the same as the size of the EC block, and therefore, data reconstruction is implemented at a granularity of the EC block. A reconstruction method is of low complexity.

According to another aspect, an embodiment of the present disclosure provides a storage node. The storage node implements functions of the first storage node in the foregoing method. The functions may be implemented using hardware or by executing corresponding software by hardware. The hardware or software includes one or more modules corresponding to the foregoing functions.

In a possible design, a structure of the storage node includes a processor and a memory. The processor is configured to support the storage node to perform corresponding functions in the foregoing system. The memory is configured to couple to the processor, and the memory stores a program instruction and data necessary for performing the foregoing functions by the storage node.

According to still another aspect, an embodiment of the present disclosure provides a distributed storage system. The distributed storage system implements functions of the first storage node, the second storage node, the storage client, and the partition view management module in the foregoing method. The functions may be implemented using hardware or by executing corresponding software by hardware. The hardware or software includes one or more modules corresponding to the foregoing functions.

According to yet another aspect, an embodiment of the present disclosure provides a computer storage medium configured to store computer software instructions used by the first storage node, and the computer storage medium includes a program involved in executing the foregoing aspects.

BRIEF DESCRIPTION OF DRAWINGS

To describe the technical solutions in the embodiments of the present disclosure more clearly, the following briefly describes the accompanying drawings required for describing the embodiments. The accompanying drawings in the following description only show some embodiments of the present disclosure, and a person of ordinary skill in the art can derive other implementation manners from these accompanying drawings without creative efforts. All these embodiments or implementation manners shall fall within the protection scope of the present disclosure.

DESCRIPTION OF EMBODIMENTS

Figure 1:
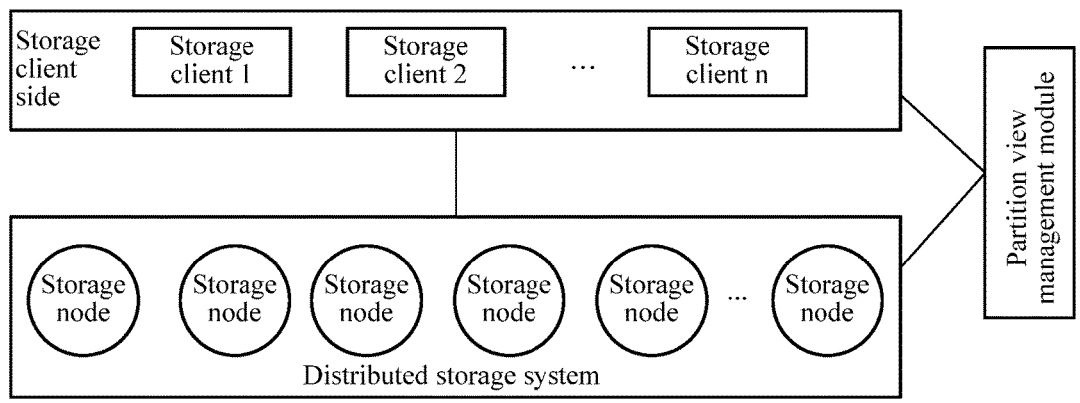
FIG. 1 is a schematic structural diagram of a possible distributed storage system that implements the present disclosure.

The technical solutions according to embodiments of the present disclosure are clearly described in the following with reference to the accompanying drawings. The described embodiments are only some but not all of the embodiments of the present disclosure. All other embodiments obtained by a person of ordinary skill in the art based on the embodiments of the present disclosure without creative efforts shall fall within the protection scope of the present disclosure.

A network architecture and a service scenario described in the embodiments of the present disclosure are to more clearly describe the technical solutions in the embodiments of the present disclosure, but are not intended to limit the technical solutions provided in the embodiments of the present disclosure. A person of ordinary skill in the art may know that as the network architecture evolves and a new service scenario emerges, the technical solutions provided in the embodiments of the present disclosure also apply to a similar technical problem.

When data is to be stored in a distributed storage system using an EC technology, one or more EC stripes are generated according to a size of the to-be-stored data, and m data blocks and k check blocks of each EC stripe are distributed, for storage, to m+k storage nodes in the distributed storage system. Each data block or check block in the EC stripe may also be referred to as an erasure code block (EC block). When a node in the distributed storage system is faulty, provided that a quantity of faulty nodes is less than k, an EC block stored on the faulty node can be restored according to an EC block, in an EC stripe, on a non-faulty node. A restoration method is m EC blocks that belong to one EC stripe and that are stored on at least m storage nodes are first obtained; EC decoding is performed on data in the m EC blocks, so that an EC block, in the EC stripe, on a faulty node can be restored. Therefore, the distributed storage system in which data is stored using the EC technology has high reliability.

However, the EC decoding technology has a relatively high requirement for a computation capability of the distributed storage system. Besides, restoring data of one EC block on a faulty node needs to transmit data of m EC blocks, resulting in a relatively high burden on network transmission. To resolve the foregoing problem, the embodiments of the present disclosure provide a data reconstruction method in the distributed storage system. When a storage node is faulty, an EC block originally to be written to the faulty node is temporarily stored on another storage node (preferably, stored on a primary storage node). After the faulty node recovers, the EC block stored on the another storage node is written back to the faulty node that has recovered, so as to implement reconstruction of data in the EC block on the faulty node. According to the solution provided in this application, EC decoding is not performed, and therefore, computation resources are reduced. In addition, during data reconstruction, only to-be-reconstructed data needs to written back to a faulty node that has recovered, reducing bandwidth consumption in network transmission. In a possible implementation manner, a primary storage node stores data allocated to a faulty node. Free storage space is allocated on the primary storage node. When a storage node is faulty, data originally to be written to the faulty node is temporarily stored in the free storage space of the primary storage node. When the faulty node recovers, the data stored on the primary node is directly sent to the faulty node.

As shown in FIG. 1, FIG. 1 is a schematic structural diagram of a distributed storage system according to an embodiment of the present disclosure. The distributed storage system includes multiple storage nodes, multiple storage clients, and a partition view (PT View) management module. The storage client receives a data storage request sent by an upper-layer application and uses an erasure code technology to store to-be-written data to the multiple storage nodes for redundancy backup storage. Functions of the components in FIG. 1 are as follows.

The PT view management module may be deployed on a server or a storage node. The PT view management module has the following main functions.

1. The PT view management module monitors a status of each storage node. There is a heartbeat connection between the PT view management module and each storage node, and the status of each storage node is monitored using the heartbeat connection.

When the storage node is in a normal state, it indicates that data stored on the storage node is in a normal state, and an abnormal power failure does not occur on the storage node or the storage node has completed data reconstruction after an abnormal power failure. When the storage node is in a faulty state, it indicates that data stored on the storage node is in an abnormal state, and an abnormal power failure occurs on the storage node or the storage node does not complete data reconstruction; as a result, the data does not synchronize with data on other storage nodes.

2. The PT view management module generates and updates a partition view. The PT view management module generates or updates the partition view based on the statuses of and a quantity of the storage nodes and according to a partition partition allocation algorithm. A storage node corresponding to each partition includes one primary storage node and several secondary storage nodes. A total quantity of storage nodes corresponding to each partition is a quantity of EC blocks included in an EC stripe, that is, m+k. As shown in the following, the table is a schematic diagram of the PT view provided in this embodiment of the present disclosure. m+k storage nodes are allocated to each partition, one of the storage nodes is designated as the primary storage node, and the other storage nodes are designated as the secondary storage nodes. The partition view includes current status information of each storage node.

| Partition identifier (ID) | Storage node identifier | Node identity | Status information |
|---|---|---|---|
| **** | 1 | Primary node | Normal |
| | 2 | Secondary node | Normal |
| | ... | ... | ... |
| | m + k | Secondary node | Faulty |

The partition view may be manually set by an administrator, or may be allocated by a management server, provided that partitions are discretely allocated to storage nodes as much as possible. An establishment manner of the partition view is not limited in this embodiment of the present disclosure.

3. The PT view management module publishes the partition view to each storage client and each storage node.

The storage client is a logical function module deployed on a server and is responsible for receiving a data storage request sent by an external host and converting the data storage request into an input/output (IO) request, in a key-value pair (Key-Value) form, for a storage node.

The storage node may be a physical storage node, or may be multiple logical storage nodes obtained by dividing a physical storage node. Main functions of the storage node include data-related processing (such as EC encoding), distributed transaction (two-phase transaction) completion processing, and processing of final conversion of IO into a read/write request for a disk.

Preferably, in a primary storage node in each partition, free storage space needs to be allocated for storing data of an EC block allocated to a faulty storage node to which writing fails. The free storage space may be referred to as a log volume. Storage space of the log volume is divided into several log blocks. A size of each log block is the same as a size of an EC block. Each log block is corresponding to a log block ID. When a log block is allocated for use, metadata information is generated. In the metadata information, a partition ID, a key value of data written to the log block, a version number of the data, and an in-block data offset and an in-block data length of the EC block are recorded. The metadata information may further include an ID of the log block.

In a possible implementation manner, a free log block may be managed using a space queue, and a used log block may be managed using a hashmap. A hash key value is the partition ID. In this way, log blocks in one partition are placed in one queue. When new data needs to be written to a log volume, a free block is first applied for in a free block list, and the free block is inserted into a corresponding hashmap according to a partition ID of the to-be-written data. After the log block is used, the log block is placed back to the free block list.

Figure 4:
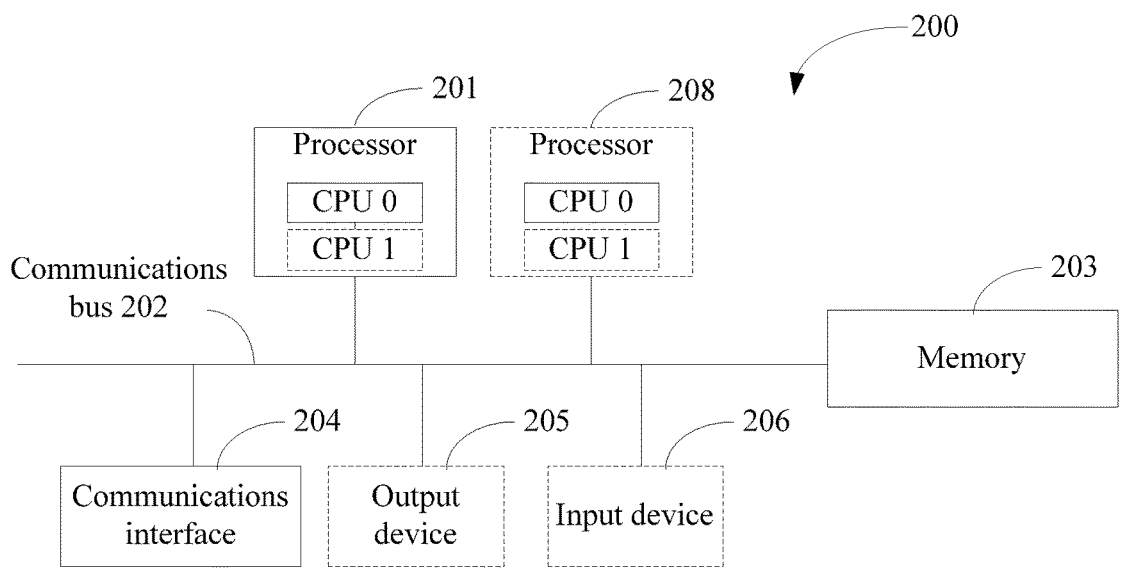
FIG. 4 is a schematic diagram of a computer device according to an embodiment of the present disclosure.

The storage client, the storage node, and the partition view management module shown in FIG. 1 may be implemented using hardware/software. For example, as shown in FIG. 4, FIG. 4 is a schematic diagram of a computer device according to an embodiment of the present disclosure. A computer device 200 includes at least one processor 201, a communications bus 202, a memory 203, and at least one communications interface 204.

The processor 201 may be a general-purpose central processing unit (CPU), a microprocessor, an application-specific integrated circuit (ASIC), or one or more integrated circuits used to control program execution in solutions of the present disclosure.

The communications bus 202 may include a path for transferring information between the foregoing components. The communications interface 204 locates on an apparatus using as any transceiver or the like, is configured to communicate with another device or a communications network such as an Ethernet, a radio access network (RAN), and a wireless local area network (WLAN).

The memory 203 may be a read-only memory (ROM) or another type of static storage device that can store static information and an instruction, a random access memory (RAM) or another type of a dynamic storage device that can store information and an instruction, or may be an electrically erasable programmable read-only memory (EEPROM), a compact disc read-only memory (CD-ROM) or another optical disc storage, an optical disc storage (including a compact optical disc, a laser disc, an optical disc, a digital versatile disc, a BLU-RAY disc, and the like), a magnetic disk storage medium or another magnetic storage device, or any other medium that can be used to carry or store expected program code in a form of an instruction or a data structure and that can be accessed by a computer. The present disclosure does not limit thereto. The memory may exist independently and may be connected to the processor using a bus. The memory may alternatively be integrated with the processor.

The memory 203 is configured to store application program code for executing the solutions of the present disclosure, and the processor 201 controls the execution. The processor 201 is configured to execute the application program code stored in the memory 203.

During specific implementation, in an embodiment, the processor 201 may include one or more CPUs, for example, a CPU 0 and a CPU 1 in FIG. 4.

During specific implementation, in an embodiment, the computer device 200 may include multiple processors, for example, the processor 201 and a processor 208 in FIG. 4. Each of these processors may be a single-core processor or a multi-core processor. The processor herein may refer to one or more devices, circuits, and/or processing cores used to process data (for example, a computer program instruction).

During specific implementation, in an embodiment, the computer device 200 may further include an output device 205 and an input device 206. The output device 205 communicates with the processor 201 and may display information in multiple manners. For example, the output device 205 may be a liquid crystal display (LCD), a light emitting diode (LED) display device, a cathode ray tube (CRT) display device, a projector, or the like. The input device 206 communicates with the processor 201 and may receive input from a user in multiple manners. For example, the input device 206 may be a mouse, a keyboard, a touchscreen device, a sensing device, or the like.

The computer device 200 may be a general-purpose computer device or a special-purpose computer device. During specific implementation, the computer device 200 may be a desktop computer, a portable computer, a network server, a personal digital assistant (PDA), a mobile phone, a tablet computer, a wireless terminal device, a communications device, an embedded device, or a device with a structure similar to that in FIG. 4. This embodiment of the present disclosure does not limit a type of the computer device 200.

The storage client, the storage node, and the partition view management module in FIG. 1 may be the device shown in FIG. 4. The memory stores one or more software modules for implementing functions of the storage client, the storage node, and the partition view management module (for example, a log block storage function of the storage node). The storage client, the storage node, and the partition view management module may implement, using the processor and the program code in the memory, a method for application topology discovery between virtual machines.

It should be noted that the computer device in FIG. 4 shows only a possible hardware implementation manner of the parts in the distributed storage system. Hardware components of the computer device may be added or deleted according to a difference or a variation in functions of the parts in the system, so as to match the functions of the parts in the system.

Figure 5:
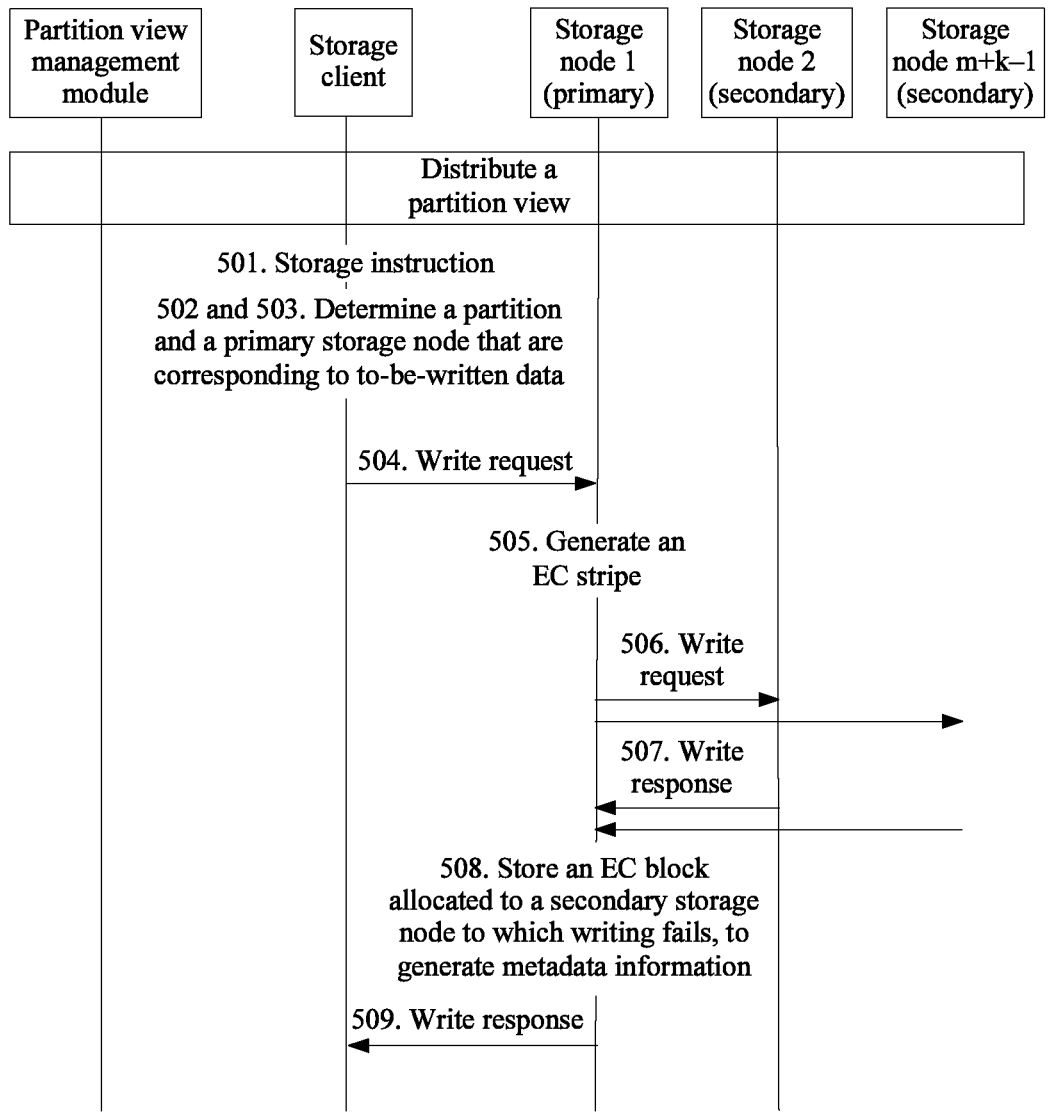
FIG. 5 is a schematic flowchart of data writing according to an embodiment of the present disclosure.

As shown in FIG. 5, FIG. 5 is a schematic flowchart of data writing when there is a faulty node according to an embodiment of the present disclosure. In this embodiment of the present disclosure, m=2 and k=1 are used as an example for description. In this case, each EC stripe includes three EC blocks. The three EC blocks need to be stored to three storage nodes, respectively. A size of the EC block is assumed to be 1 million (M). In this embodiment of the present disclosure, a storage node 2 being in a faulty state is used as an example for description.

Figure 6:
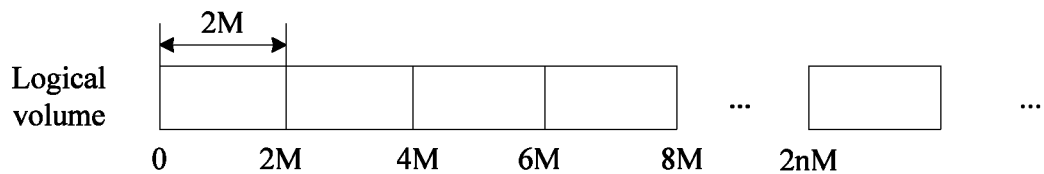
FIG. 6 is a schematic diagram of equal division of storage space of a logical volume according to an embodiment of the present disclosure.

In this embodiment of the present disclosure, for storage space of a logical volume, the logical volume is equally divided at a granularity of m EC blocks (in FIG. 6, m=2 and a size of an EC block being 1M are used as an example). As shown in FIG. 6, the diagram is a schematic diagram of equal division of storage space of a logical volume. Starting from address 0, data offset IDs of equally divided parts of the logical volume are 0, 1, 2 . . . n, respectively.

Step 501. A storage client receives a storage instruction sent by an external host, where the storage instruction carries to-be-stored data, and a volume identifier of a logical volume, a data offset, and a data length of the to-be-stored data; the storage client generates, according to the data offset and the data length of the to-be-stored data, a data offset ID of to-be-written data that needs to be written in each write operation, where to-be-written data corresponding to each write operation is corresponding to one data offset ID.

Further, the storage client combines the volume identifier of the logical volume and the data offset ID of the to-be-written data, to generate a key value of the to-be-written data. When the to-be-written data needs to be divided into multiple write processes for data storage, a key value corresponding to to-be-written data of each write process is generated.

A process in which the storage client processes the received to-be-stored data and divides the to-be-stored data into to-be-written data corresponding to multiple write processes is as follows.

For example, assuming that the data length of the to-be-stored data is 3M, and the data offset is 2.5M, an address range of the logical volume that stores the to-be-stored data is 2.5M to 5.5M. The to-be-stored data falls into the second part and the third part of the equally divided logical volume. Data offset IDs respectively corresponding to the two parts are 1 and 2. In storage space for which the data offset ID is 1, a first section of to-be-written data whose address range is from 2.5M to 4M is stored. In storage space for which the data offset is 2, a second section of to-be-written data whose address range is from 4M to 5.5M is stored. In this case, the storage client divides the to-be-stored data into the two sections of to-be-written data, performs two write operations, and writes the two sections of to-be-written data to storage nodes in two separate times. A key value of the first section of to-be-written data is a character string generated by combining the volume identifier of the logical volume and the data offset ID 1. A key value of the second section of to-be-written data is a character string generated by combining the volume identifier of the logical volume and the data offset ID 2. It can be learned that the key value of the to-be-written data is determined by the address range of the to-be-written data and is unrelated to specific content of the to-be-written data.

It should be noted that in this embodiment of the present disclosure, writing the first section of to-be-written data is used as an example for description. In this case, the address range of the to-be-written data is from 2.5M to 4M. A person skilled in the art may understand that when the to-be-stored data is divided into multiple sections of data, and multiple write operations need to be performed, processes of the multiple write operations are similar. Considering that data offset IDs of to-be-written data in different write processes are different, key values of the to-be-written data in the different write processes are different, and a data offset and a data length of the to-be-written data in each write operation change.

In this embodiment of the present disclosure, the to-be-stored data is the to-be-stored data included in the storage instruction that is received by the storage client from an upper-layer application or the external host. The to-be-written data is data written to each storage node by the storage client in one write operation. The to-be-written data in one write process is written to each storage node in a form of an EC stripe.

Step 502. The storage client calculates a hash value of a key value of the to-be-written data and determines a partition ID corresponding to the calculated hash value.

Figure 7:
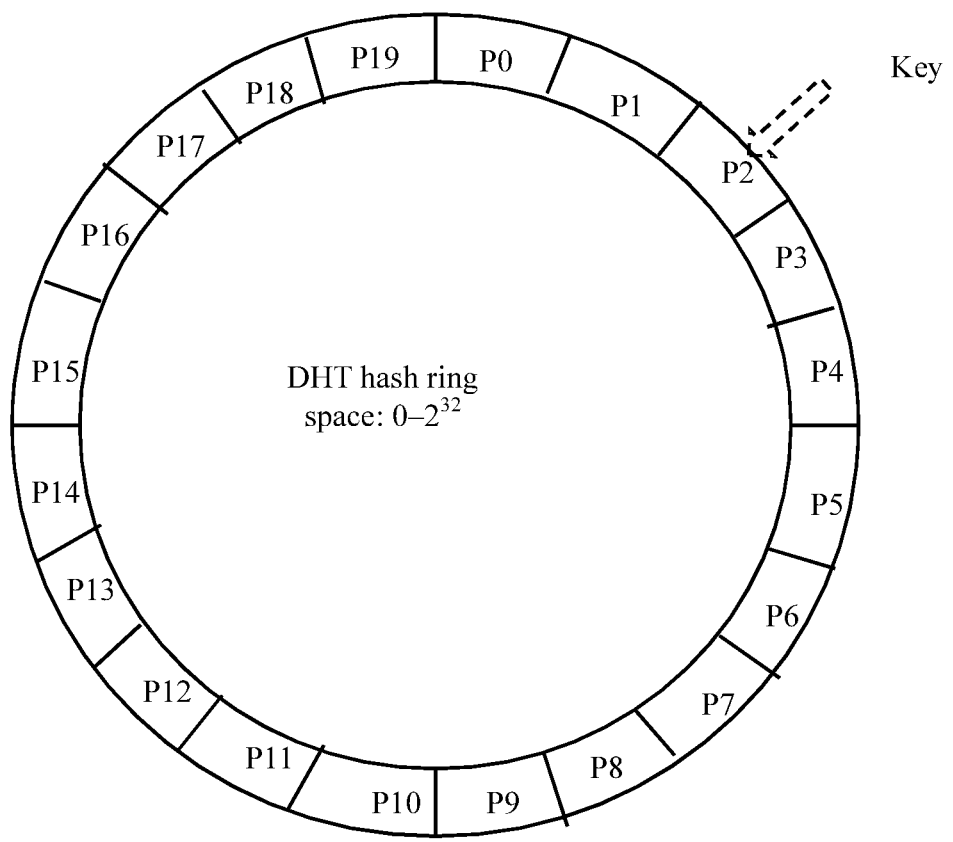
FIG. 7 is a schematic diagram of a distributed hash table (DHT) hash ring according to an embodiment of the present disclosure.

In a possible implementation manner, the partition ID corresponding to the key value of the to-be-written data may be calculated in a consistent hashing manner. As shown in FIG. 7, FIG. 7 is an example of a DHT hash ring. During system initialization, an integer interval in a large range of $[0, 2^{32}-1]$ is segmented into multiple partitions (partition) with an equal interval size. Quantities of hash integers in the partitions are the same, representing hash space with same length. According to the hash value of the key value of the to-be-written data, a partition ID of a partition into which the hash value falls is determined.

Step 503. The storage client queries a partition view according to the partition ID and determines a primary storage node that processes the to-be-written data.

A partition view management module in a distributed storage system maintains a correspondence between a partition and a storage node (the storage node may be a physical node or multiple logical nodes obtained by logically dividing a physical node). The correspondence is the partition view.

Further, when the to-be-stored data is relatively large and needs to be divided into multiple pieces of to-be-written data for being written to storage nodes after multiple write processes, a data offset of a first section of to-be-written data is the same as the data offset of the to-be-stored data, and a data offset of each subsequent section of to-be-written data is 0. When the to-be-stored data can be written in one write process, a data offset of the to-be-written data is the data offset of the to-be-stored data.

Step 504. The storage client sends a write request to the primary storage node, where the write request carries the to-be-written data, the key value, a data offset, a data length, and the partition ID that are corresponding to the to-be-written data, and the like.

In this embodiment of the present disclosure, a storage node 1 being the primary storage node and the storage node 2 and a storage node 3 being secondary storage nodes are used as an example for description.

Step 505. The primary storage node performs EC encoding on the to-be-written data, to generate m data blocks and k check blocks, where m+k EC blocks constitute an EC stripe and are processed by m+k storage nodes (including the primary storage node) respectively; and the primary storage node generates or updates a version number of the to-be-written data and stores a correspondence between the key value and the version number.

The primary storage node segments the to-be-written data at a granularity of an EC block, to obtain the m data blocks; and performs EC encoding to generate the k check blocks corresponding to the m data blocks. The primary storage node performs the foregoing processing on the to-be-written data to generate the m+k EC blocks. The primary storage node generates a data offset and a data length for each EC block. For example, an address range of the to-be-written data is from 2.5M to 4M, and a size of the EC block is 1M. Therefore, the to-be-written data is divided into two EC blocks: 2M-3M and 3M-4M. An in-block data offset of the first EC block is 0.5M, and an in-block data length of the first EC block is 0.5M. An in-block data offset of the second EC block is 0M, and an in-block data length of the second EC block is 1M. A data offset of the check block is a minimum value of data offsets of the EC blocks. A data length of the check block is obtained by superposing address ranges of data lengths of the EC blocks. In this example, k=1, that is, one check block is generated. In this case, an in-block data offset of the check block is 0, and a data length of the check block is 1M. In a possible implementation manner, the primary storage node records the in-block data offset and the in-block data length of the check block, and the check block is written to each secondary storage node at a granularity of the entire block.

It should be noted that the in-block data offset and the in-block data length of the EC block may be calculated using a common EC encoding manner in the prior art. This is not limited in this embodiment of the present disclosure.

In a possible implementation manner, when data is to be written to the storage space of a logical volume for the first time, in a write operation process, the primary storage node generates a version number, of the to-be-written data, stored in the storage space. In a process in which data stored in the storage space is updated, the primary storage node updates the version number, and a manner of increasing a version number by 1 during each time of updating may be used.

Step 506. The primary storage node determines, according to the partition view, a secondary storage node corresponding to the partition ID, and sends a write request to the secondary storage node, where the write request carries the key value and the version number that are of the to-be-written data, and data content, an in-block data offset, and an in-block data length that are of an EC block allocated to the secondary storage node.

In a possible implementation manner, the write request may be a prepare request. The primary storage node processes one EC block and sends the remaining m+k-1 EC blocks to m+k−1 secondary storage nodes, corresponding to the partition ID, in the partition view, respectively. The primary storage node may randomly allocate the EC blocks or allocate the EC blocks in a sequence of identifiers of the storage nodes. This is not limited in this embodiment of the present disclosure.

Step 507. The secondary storage node receives the write request and writes, according to the write request, the data content in the EC block to disk address space corresponding to the in-block data offset and the in-block data length; the secondary storage node records the key and the version number that are of the to-be-written data; after a write operation is completed, the secondary storage node returns a write success response to the primary storage node; and if a fault occurs on the secondary storage node and causes a write failure, the secondary storage node returns a write failure response to the primary storage node.

In a possible implementation manner, the write response is a prepare log message, which carries an identifier indicating a success or failure.

In a possible implementation manner, the primary storage node may determine, according to status information of a storage node in the partition view, whether the secondary storage node is faulty. If the secondary storage node is faulty, the primary storage node may directly and locally store an EC block that is allocated to the faulty secondary storage node, and skip step 506 and step 507.

Step 508. The primary storage node receives a write response returned by each secondary storage node; when determining that a quantity of secondary storage nodes to which writing succeeds is greater than or equal to m, the primary storage node determines that this write operation succeeds, and stores an EC block allocated to a secondary storage node to which writing fails, to generate metadata information, where the metadata information includes the partition ID, the key value, and the version number that are of the to-be-written data, and an in-block data offset and an in-block data length of the EC block of which the write fails.

In a possible manner, when receiving the write success response returned by the secondary storage node, the primary storage node may determine that the secondary storage node that sends the write success response has successfully written the to-be-written data onto a disk. In addition, the primary storage node may receive a node status notification message from the partition view management module and determine that writing to a faulty node fails. Alternatively, the primary storage node receives the write failure response and determines that writing to the secondary storage node that sends the write failure response fails.

In the metadata information, the key value is the key value of the to-be-written data received by the primary storage node in step 504, the version number is the version number corresponding to the key value and generated in step 505, the in-block data offset and the in-block data length are included in the write request sent by the primary storage node to the secondary storage node to which the write fails in step 506, and the partition ID is the partition ID to which the to-be-written data sent by the storage client to the primary storage node belongs in step 504.

Figure 3:
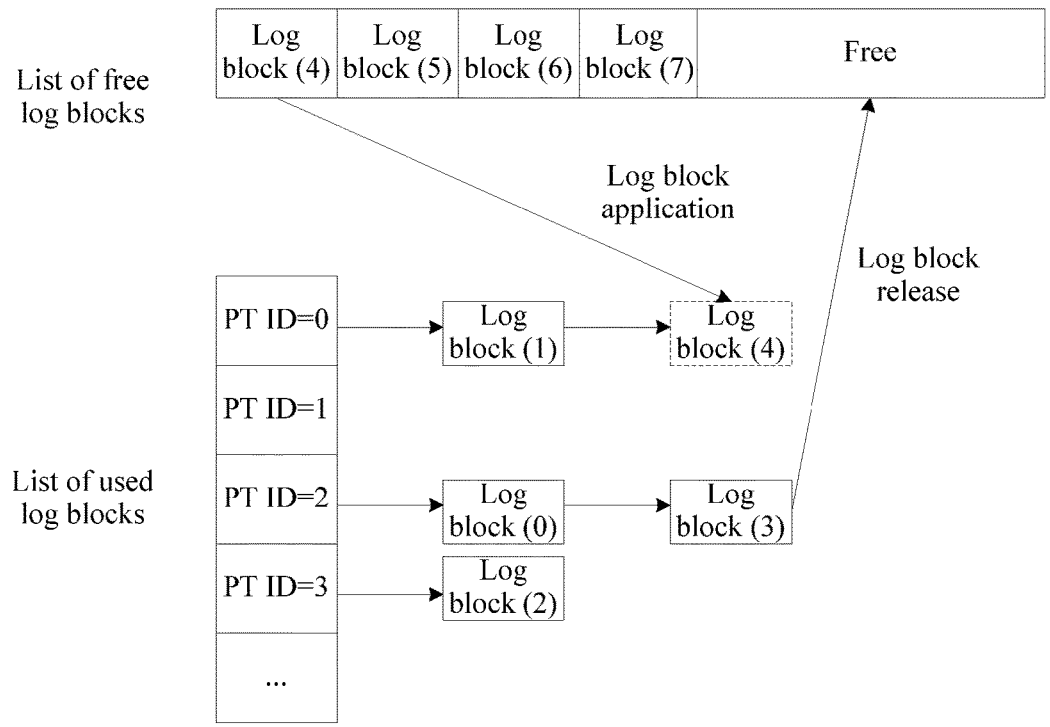
FIG. 3 is a schematic diagram of management logic of a log block according to an embodiment of the present disclosure.

A specific manner in which the primary storage node stores the to-be-written data allocated to the secondary storage node to which the write fails may be a manner shown in FIG. 3.

In a possible implementation manner, when a quantity of secondary storage nodes to which writing fails is greater than k, the primary storage node determines that a write fails and returns a write failure response to the storage client.

Step 509. The primary storage node returns an acknowledgment message to the secondary storage node to which the write succeeds, and returns a write success response to the storage client.

In a possible implementation manner, the acknowledgment message is a commit message.

Figure 8:
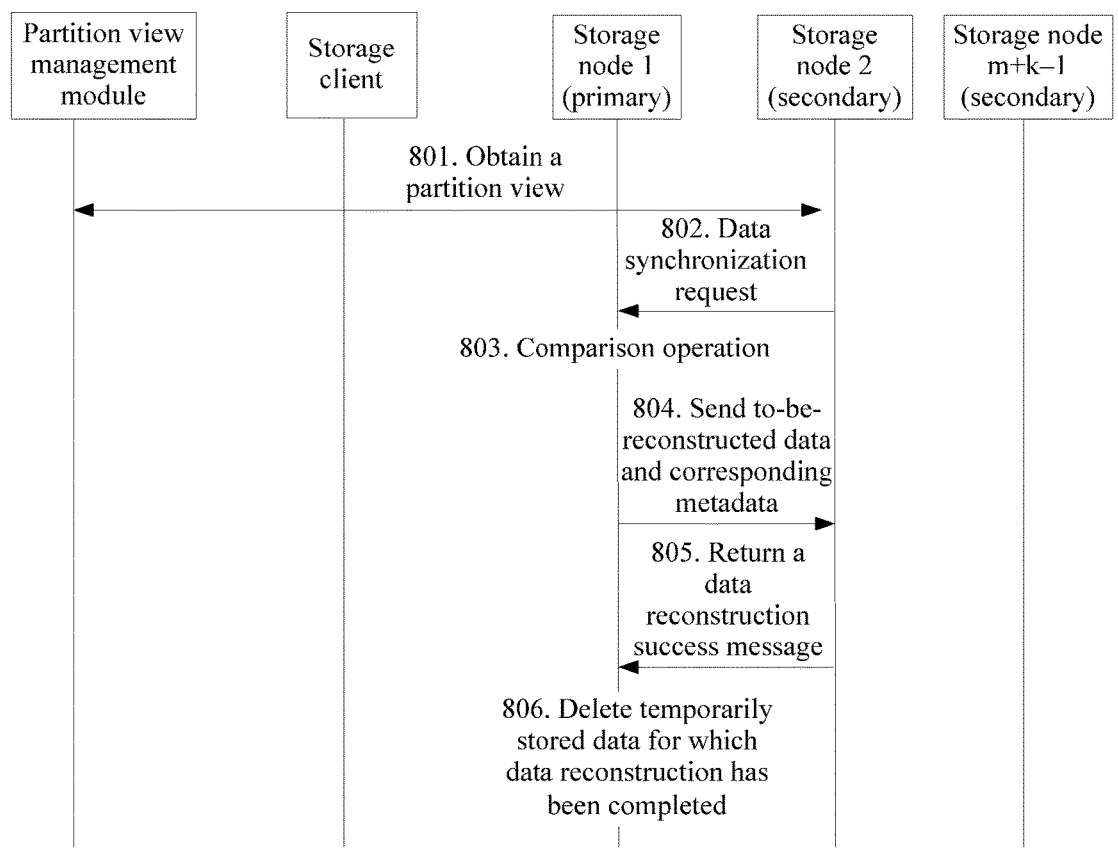
FIG. 8 is a schematic flowchart of a data reconstruction method after a faulty node recovers according to an embodiment of the present disclosure.

As shown in FIG. 8, an embodiment of the present disclosure further provides a schematic flowchart of a data reconstruction method after a faulty node recovers. The method includes the following steps.

Step 801. After recovering from a fault, a storage node 2 obtains a partition view from a partition view management module, where the partition view includes a partition ID, and a primary storage node and a secondary storage node that are corresponding to the partition ID.

When receiving a partition view obtaining request sent by the storage node 2, the partition view management module returns, to the storage node 2, a partition view of a partition related to the storage node 2. The partition related to the storage node 2 is a partition in which the primary storage node or the secondary storage is the storage node 2.

In a possible implementation manner, when a storage node is faulty, because the faulty node may be a primary storage node corresponding to some partition IDs, a management module of a distributed storage system downgrades the faulty node to a secondary storage node and updates a partition view.

In a possible implementation manner, a faulty node may be corresponding to multiple partition IDs and is a secondary storage node for the multiple partition IDs. The faulty node performs data reconstruction at a granularity of a partition. In this embodiment of the present disclosure, data of one partition on a faulty node being reconstructed is used as an example for description. The storage node 2 requests the primary storage node corresponding to the partition ID to perform data synchronization. A person skilled in the art may understand that when data of multiple partitions on a storage node needs to be synchronized, the storage node may request a primary storage node corresponding to each partition ID to perform data synchronization.

Step 802. The storage node 2 sends a data synchronization request to the primary storage node, where the data synchronization request carries the partition ID, a key value, and a version number corresponding to the key value.

It should be noted that in a possible implementation manner, the storage node 2 may first send the partition ID to the primary storage node. After receiving the partition ID, the primary storage node obtains, from the storage node 2, all key values belonging to the partition ID and version numbers corresponding to the key values. A person skilled in the art may understand that data in a partition can be reconstructed in multiple separate times. This is not limited in this embodiment of the present disclosure.

Step 803. The primary storage node compares key values corresponding to the partition ID and version numbers corresponding to the key values that are recorded on the primary storage node with all key values corresponding to the partition ID and version numbers corresponding to the all key values that are reported by the storage node 2.

Case 1: When a key value corresponding to the partition ID recorded on the primary storage node is not included in the key values corresponding to the partition ID reported by the storage node 2, it indicates that when the storage node 2 is faulty, new data (which is corresponding to the key value that is not included) is written, and an EC block corresponding to the new data has been successfully written on the primary storage node. However, because the storage node 2 is faulty, and the EC block allocated to the storage node 2 is temporarily stored on the primary storage node, the data (which is the EC block allocated to the storage node 2) corresponding to the key value is not written on the storage node 2. The primary storage node sends, to the storage node 2, the EC block allocated to the storage node 2 and metadata information, and the storage node 2 reconstructs the data corresponding to the key value.

Case 2: When a version number corresponding to the key value is the same as a version number corresponding to the key value reported by the storage node 2, it indicates that data corresponding to the key value on the storage node 2 does not need to be updated. That is, when the storage node 2 is faulty, the data corresponding to the key value is not updated, and the version number does not change.

Case 3: When the primary storage node does not obtain the key value through query, it indicates that data corresponding to the key value on the primary storage node has been deleted. The primary storage node instructs the storage node 2 to delete the data corresponding to the key value.

Case 4: When a version number corresponding to the key value in the primary storage node is greater than a version number corresponding to the key value reported by the storage node 2, it indicates that in a period when the storage node 2 is faulty, data corresponding to the key value is updated. The primary storage node sends, to the storage node 2, the data (which is an EC block allocated to the storage node 2) corresponding to the key value and metadata information, and the storage node 2 reconstructs the data corresponding to the key value.

In case 1 and case 4, the data needs to be reconstructed. A specific data reconstruction process includes the following steps.

Step 804. The primary storage node searches for metadata information according to the partition ID and a key value corresponding to to-be-reconstructed data, and determines a log volume and metadata information that are corresponding to a to-be-reconstructed EC block; the primary storage node sends, to the storage node 2, a to-be-reconstructed EC block recorded in the log volume and an in-block data offset, an in-block data length, and a version number that are included in the metadata information.

Step 805. The storage node 2 performs data reconstruction, writes data of the EC block onto a disk according to the in-block data offset and the in-block data length of the EC block allocated to the second storage node, and updates a version number corresponding to a key value of the to-be-written data; and returns a data reconstruction success message to the primary storage node after the data reconstruction.

Step 806. The primary storage node deletes the log volume and the metadata information of the data that has been reconstructed; and the primary storage node recovers the log volume and places the log volume in a free queue.

In a possible implementation manner, when the storage node 2 is reconstructing data, if in a data recovery process, a new write request is to be written to the faulty node that is being recovered. When a location for the write has been recovered, the write may be directly performed. If the location has not been recovered or is being recovered, the write waits to be performed after the data is recovered.

In this application, a data reconstruction method in a distributed storage system, an apparatus, and a system are provided. A primary storage node in the distributed storage system performs EC encoding on to-be-written data to generate an EC stripe, and stores, on each storage node, each EC block in the EC stripe. When a fault occurs on some storage nodes and causes a write failure of EC blocks, the primary storage node locally stores an EC block allocated to a storage node to which the write fails and generates metadata information required for data reconstruction. After the storage node recovers from the fault, the primary storage node sends, to the storage node, the stored EC block allocated to the storage node to which the write fails and the metadata information corresponding to the EC block, so that the storage node that recovers from the fault completes the data reconstruction. According to the data reconstruction solution in the distributed storage system provided in this application, when some storage nodes are faulty, there is no need to perform EC decoding to restore data on the faulty nodes. Instead, the primary storage node temporarily stores EC blocks allocated to the faulty nodes and sends, after the faulty nodes recover, the temporarily stored EC blocks to the faulty nodes for data reconstruction. According to the foregoing solution, consumption of computation resources that results from EC decoding is avoided when a storage node is faulty, and consumption of network resources that results from a large quantity of data transfer is also avoided when EC decoding is performed. For example, when EC encoding is 4+2, four copies of data are needed for restoring one copy of data. However, in this application, the primary storage node re-sends one copy of data to the faulty node after the faulty node recovers, obviously reducing consumption of network resources. Further, in the distributed storage system, a probability of losing one copy of data is far greater than that of losing two copies of data, and when one copy of data is lost, original data can still be restored. Therefore, EC decoding does not need to be immediately performed to restore the lost data, and after the faulty node recovers, using the data reconstruction solution provided in this application can synchronize the data on the faulty node with that on the other storage nodes.

Corresponding to the foregoing embodiment of the data reconstruction method in the distributed storage system described above as shown in FIG. 9, an embodiment of the present disclosure further provides a storage node. The storage node includes an obtaining unit 901 configured to obtain to-be-written data and a key value of the to-be-written data, update a version number corresponding to the key value, and perform EC encoding on the to-be-written data to generate an EC stripe, where the EC stripe includes m+k EC blocks, the m EC blocks are data blocks, the k EC blocks are check blocks, m is a positive integer greater than or equal to 2, and k is a natural number; a processing unit 902 configured to query a partition view and determine a secondary storage node corresponding to a partition to which the to-be-written data belongs, where first storage node is a primary storage node corresponding to the partition, and a second storage node is one of secondary storage nodes corresponding to the partition; and a sending unit 903 configured to send a write request to each secondary storage node, where the write request carries a partition ID of the partition to which the to-be-written data belongs, the key value and the version number of the to-be-written data, and data of an EC block allocated to each secondary storage node.

The processing unit 902 is configured to, when determining that writing to the second storage node fails, store data of an EC block allocated to the second storage node, and generate metadata information corresponding to the EC block allocated to the second storage node. The metadata information includes the partition ID of the partition to which the to-be-written data belongs, and the key value and the version number of the to-be-written data.

After the second storage node recovers from a fault, the sending unit 903 is further configured to send, to the second storage node, the stored data of the EC block allocated to the second storage node and the metadata information, so that the second storage node performs data reconstruction.

Further, the processing unit 902 is further configured to determine that a quantity of storage nodes to which writing succeeds is greater than or equal to m.

The obtaining unit 901 is further configured to receive a data synchronization request sent by the second storage node, where the data synchronization request carries the partition ID, and obtain, from the second storage node, a key value corresponding to the partition ID and a version number of the key value that are recorded on the second storage node.

The processing unit 902 is further configured to compare a key value corresponding to the partition ID and a version number of the key value that are recorded by the processing unit 902, with the key value corresponding to the partition ID and the version number of the key value that are obtained from the second storage node, and determine, according to a comparison result, that data reconstruction needs to be performed.

The sending unit 903 is configured to send, according to the metadata information, stored data, of an EC block corresponding to the key value, for which data reconstruction is needed and metadata information of the EC block, to the second storage node for data reconstruction.

The processing unit 902 is configured to perform at least one of the following comparison processing, when the version number corresponding to the key value recorded on the storage node is the same as the version number corresponding to the key value obtained from the second storage node, skipping performing data reconstruction; when the key value recorded on the storage node does not include the key value obtained from the second storage node, instructing the second storage node to delete data corresponding to the key value that is not included in the storage node; when the version number corresponding to the key value recorded on the storage node is greater than the version number corresponding to the key value obtained from the second storage node, performing a data reconstruction operation; or when the key value recorded on the storage node is not included in the key value obtained from the second storage node, instructing the second storage node to reconstruct the data corresponding to the key value that is not included in the second storage node.

The processing unit 902 is further configured to equally divide a storage address of a logical volume at a granularity of the m EC blocks, to obtain multiple storage units, and allocate data offset identifiers to the multiple storage units.

The obtaining unit 901 is configured to calculate a hash value corresponding to the key value of the to-be-written data using a consistent hashing algorithm, and determine a partition ID of a partition to which the hash value belongs.

Alternatively, the obtaining unit 901 is configured to obtain the partition ID of the partition corresponding to the to-be-written data from a write request sent by a storage client.

The obtaining unit 901 is further configured to receive a write failure response returned by the second storage node, and determine that writing to the second storage node fails.

Alternatively, the obtaining unit 901 is further configured to determine, according to the partition view, that a status of the second storage node is faulty, where the partition view includes status information of a storage node.

The processing unit 902 is configured to allocate free storage space as a log volume, to store an EC block allocated to a storage node to which writing fails. The log volume includes at least one log block, and a size of the log block is the same as a size of the EC block.

Figure 10:
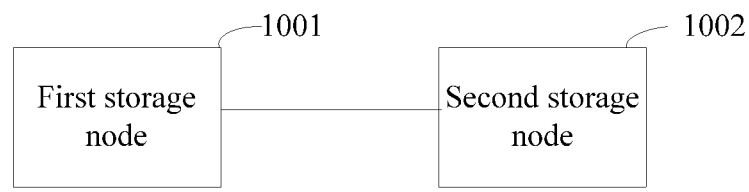
FIG. 10 is a schematic structural diagram of a distributed storage system according to an embodiment of the present disclosure.

As shown in FIG. 10, an embodiment of the present disclosure further provides a distributed storage system, including a first storage node 1001 and a second storage node 1002.

The first storage node 1001 is configured to obtain to-be-written data and a key value of the to-be-written data, update a version number corresponding to the key value, and perform erasure code EC encoding on the to-be-written data to generate an EC stripe. The EC stripe includes m+k EC blocks, the m EC blocks are data blocks, the k EC blocks are check blocks, m is a positive integer greater than or equal to 2, and k is a natural number.

The first storage node 1001 is further configured to query a partition view and determine a secondary storage node corresponding to a partition to which the to-be-written data belongs. The first storage node 1001 is a primary storage node corresponding to the partition, and the second storage node 1002 is one of secondary storage nodes corresponding to the partition.

The first storage node 1001 is further configured to send a write request to each secondary storage node. The write request carries a partition ID of the partition to which the to-be-written data belongs, the key value and the version number of the to-be-written data, and data of an EC block allocated to each secondary storage node.

When writing to the second storage node 1002 fails, the first storage node 1001 is further configured to store data of an EC block allocated to the second storage node 1002, and generate metadata information corresponding to the EC block allocated to the second storage node 1002. The metadata information includes the partition ID of the partition to which the to-be-written data belongs, and the key value and the version number of the to-be-written data.

After the second storage node 1002 recovers from a fault, the first storage node 1001 is further configured to send, to the second storage node 1002, the stored data of the EC block allocated to the second storage node 1002 and the metadata information.

The second storage node 1002 is configured to store, according to the metadata information, the data of the EC block allocated to the second storage node 1002.

A primary storage node in the distributed storage system performs EC encoding on to-be-written data to generate an EC stripe, and stores, on each storage node, each EC block in the EC stripe. When a fault occurs on some storage nodes and causes a write failure of EC blocks, the primary storage node locally stores an EC block allocated to a storage node to which the write fails and generates metadata information required for data reconstruction. After the storage node recovers from the fault, the primary storage node sends, to the storage node, the stored EC block allocated to the storage node to which the write fails and the metadata information corresponding to the EC block, so that the storage node that recovers from the fault completes the data reconstruction.

According to the data reconstruction solution in the distributed storage system provided in this application, when some storage nodes are faulty, there is no need to perform EC decoding to restore data on the faulty nodes. Instead, the primary storage node temporarily stores EC blocks allocated to the faulty nodes and sends, after the faulty nodes recover, the temporarily stored EC blocks to the faulty nodes for data reconstruction. According to the foregoing solution, consumption of computation resources that results from EC decoding is avoided when a storage node recovers from a fault and performs data reconstruction, and consumption of network resources that results from a large quantity of data transfer is also avoided when EC decoding is performed. For example, when EC encoding is 4+2, four copies of data are needed for restoring one copy of data. However, in this application, the primary storage node re-sends one copy of data to the faulty node after the faulty node recovers, obviously reducing consumption of network resources. Further, in the distributed storage system, a probability of losing one copy of data is far greater than that of losing two copies of data, and when one copy of data is lost, original data can still be restored. Therefore, EC decoding does not need to be immediately performed to restore the lost data, and after the faulty node recovers, using the data reconstruction solution provided in this application can synchronize the data on the faulty node with that on the other storage nodes.

Figure 2:
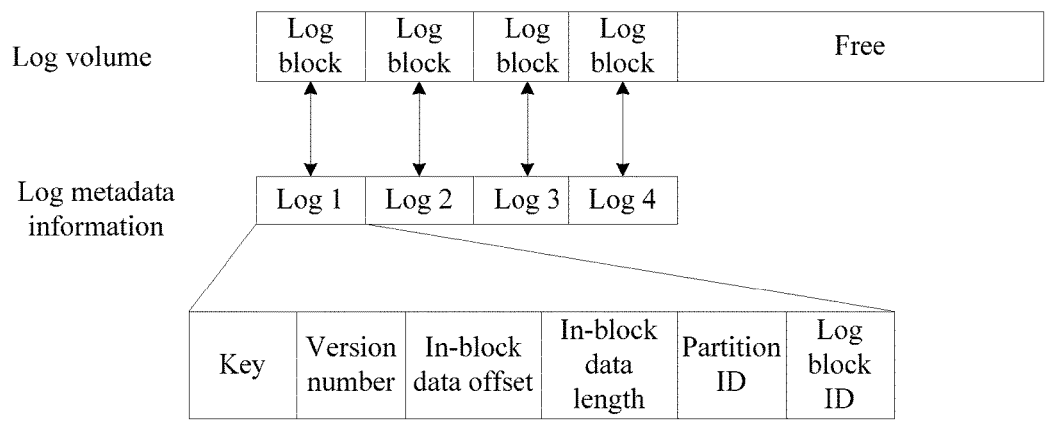
FIG. 2 is a schematic structural diagram of an EC block stored on a primary storage node according to an embodiment of the present disclosure.
Figure 9:
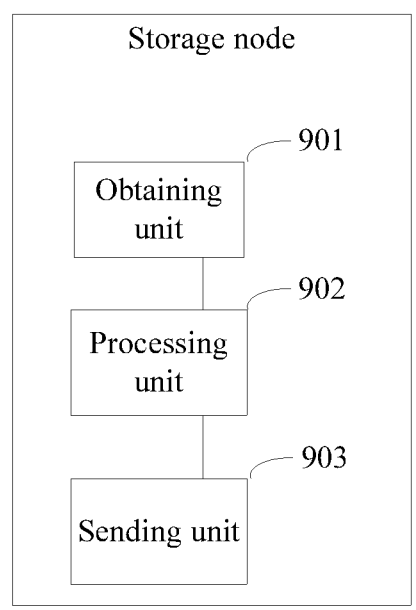
FIG. 9 is a schematic structural diagram of a storage node according to an embodiment of the present disclosure.

In the embodiments corresponding to FIG. 9 and FIG. 10, a storage node is presented in a form of a function unit/function module. The "unit/module" herein may refer to an ASIC, a circuit, a processor and a memory that execute one or more software or firmware programs, an integrated logic circuit, and/or another device capable of providing the foregoing functions. In a simple embodiment, a person skilled in the art may think that the storage node may be in the form shown in FIG. 2. For example, the obtaining unit 901, the processing unit 902, and the sending unit 903 may be implemented using the processor and the memory in FIG. 4.

An embodiment of the present disclosure further provides a computer storage medium configured to store computer software instructions used by the device shown in FIG. 9 and FIG. 10. The computer storage medium includes a program involved in executing the foregoing method embodiments. A data reconstruction method in a distributed storage system can be implemented by executing the stored program.

Although the present disclosure is described with reference to the embodiments, in a process of implementing the present disclosure that claims protection, a person skilled in the art may understand and implement another variation of the disclosed embodiments by viewing the accompanying drawings, disclosed content, and the accompanying claims. In the claims, "comprising" does not exclude another component or another step, and "a" or "one" does not exclude a case of multiple. A single processor or another unit may implement several functions enumerated in the claims. Some measures are recorded in dependent claims that are different from each other, but this does not mean that these measures cannot be combined to produce a better effect.

A person skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a CD-ROM, an optical memory, and the like) that include computer-usable program code. The computer program is stored/distributed in a proper medium and is provided as or used as a part of the hardware together with another hardware, or may also use another allocation form, such as using the Internet or another wired or wireless telecommunications system.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although the present disclosure is described with reference to specific features and the embodiments thereof, obviously, various modifications and combinations may be made to them without departing from the spirit and scope of the present disclosure. Correspondingly, the specification and accompanying drawings are only exemplary description of the present disclosure defined by the accompanying claims, and is considered as any of or all modifications, variations, combinations or equivalents that cover the scope of the present disclosure. Obviously, a person skilled in the art can make various modifications and variations to the present disclosure without departing from the spirit and scope of the present disclosure. The present disclosure is intended to cover these modifications and variations provided that they fall within the scope of protection defined by the following claims and their equivalent technologies.

What is claimed is:

1. A data reconstruction method in a distributed storage system, comprising:
    obtaining, by a first storage node, to-be-written data and a key value of the to-be-written data;
    updating a version number corresponding to the key value;
    performing erasure code (EC) encoding on the to-be-written data to generate an EC stripe, wherein the EC stripe comprises m+k EC blocks, wherein the m EC blocks are data blocks, wherein the k EC blocks are check blocks, wherein m is a positive integer greater than or equal to 2, and wherein k is a natural number;

calculating, by the first storage node, a hash value corresponding to the key value of the to-be-written data using a consistent hashing algorithm;

determining a partition ID of a partition to which the hash value belongs;

querying, by the first storage node, a partition view;

determining a secondary storage node corresponding to the partition to which the to-be-written data belongs, wherein the first storage node is a primary storage node corresponding to the partition, and wherein a second storage node is one of secondary storage nodes corresponding to the partition;

sending, by the first storage node, a write request to each secondary storage node, wherein the write request carries a partition identifier (ID) of the partition to which the to-be-written data belongs, the key value and the version number of the to-be-written data, and data of an EC block allocated to each secondary storage node;

storing, by the first storage node, data of an EC block allocated to the second storage node when writing to the second storage node fails;

generating metadata information corresponding to the EC block allocated to the second storage node, wherein the metadata information comprises the partition ID of the partition to which the to-be-written data belongs, and the key value and the version number of the to-be-written data; and sending, by the first storage node to the second storage node after the second storage node recovers from a fault, the stored data of the EC block allocated to the second storage node and the metadata information, such that the second storage node performs data reconstruction.

2. The method according to claim 1, wherein before storing, by the first storage node, the data of the EC block allocated to the second storage node, the method further comprises determining, by the first storage node, that a quantity of storage nodes to which writing succeeds is greater than or equal to m.

3. The method according to claim 2, further comprising:

equally dividing a storage address of a logical volume at a granularity of the m EC blocks in order to obtain multiple storage units; and allocating data offset identifiers to the multiple storage units.

4. The method according to claim 3, wherein before obtaining, by the first storage node, the to-be-written data, the method further comprises:

receiving, by a storage client, a storage instruction sent by an upper-layer application, wherein the storage instruction carries to-be-stored data, a volume identifier, a data offset, and a data length of the logical volume that stores the to-be-stored data;

determining, by the storage client, at least one storage unit corresponding to an address range within which the to-be-stored data is stored; and using some of the to-be-stored data corresponding to each storage unit as the to-be-written data that needs to be written to the distributed storage system in one write operation.

5. The method according to claim 1, wherein the write request sent by the first storage node to each secondary storage node further carries an in-block data offset and an in-block data length of the EC block allocated to each secondary storage node, such that each storage node writes the data of the EC block according to the data offset and the in-block data length that are carried in the received write request.

6. The method according to claim 5, wherein after the second storage node recovers from the fault, the method further comprises:

writing, by the second storage node, the data of the EC block onto a disk according to the in-block data offset and the in-block data length of the EC block allocated to the second storage node; and updating the version number corresponding to the key value of the to-be-written data.

7. The method according to claim 1, wherein before sending, by the first storage node to the second storage node, the stored data of the EC block allocated to the second storage node and the metadata information, the method further comprises:

receiving, by the first storage node, a data synchronization request sent by the second storage node, wherein the data synchronization request carries the partition ID;

obtaining, by the first storage node from the second storage node, a key value corresponding to the partition ID and a version number of the key value that are recorded on the second storage node;

comparing, by the first storage node, a key value corresponding to the partition ID and a version number of the key value that are recorded on the first storage node, with a key value corresponding to the partition ID and a version number of the key value that are obtained from the second storage node;

determining, according to a comparison result, that data reconstruction needs to be performed; and sending, by the first storage node according to the metadata information, stored data to the second storage node for data reconstruction, wherein the stored data is of an EC block corresponding to the key value for which data reconstruction is needed and metadata information of the EC block.

8. The method according to claim 7, wherein comparing the key value corresponding to the partition ID and the version number of the key value that are recorded on the first storage node comprises at least one of the following:

skipping performing data reconstruction when the version number corresponding to the key value recorded on the first storage node is the same as the version number corresponding to the key value obtained from the second storage node;

instructing the second storage node to delete data corresponding to the key value that is not comprised in the first storage node when the key value recorded on the first storage node does not comprise the key value obtained from the second storage node;

performing a data reconstruction operation when the version number corresponding to the key value recorded on the first storage node is greater than the version number corresponding to the key value obtained from the second storage node; and instructing the second storage node to reconstruct the data corresponding to the key value that is not comprised in the second storage node when the key value recorded on the first storage node is not comprised in the key value obtained from the second storage node.

9. The method according to claim 1, wherein before querying, by the first storage node, the partition view, the method further comprises obtaining, by the first storage node from a storage client, the partition ID of the partition corresponding to the to-be-written data.

10. The method according to claim 1, wherein determining, by the first storage node, that writing to the second storage node fails comprises:
receiving, by the first storage node, a write failure response returned by the second storage node; and
determining that writing to the second storage node fails.

11. The method according to claim 1, wherein determining, by the first storage node, that writing to the second storage node fails comprises determining, by the first storage node according to the partition view, that a status of the second storage node is faulty, wherein the partition view comprises status information of a storage node.

12. The method according to claim 1, wherein storing, by the first storage node, the data of the EC block allocated to the second storage node comprises allocating, by the first storage node, free storage space as a log volume in order to store an EC block allocated to a storage node to which writing fails, wherein the log volume includes at least one log block, and wherein a size of the log block is the same as a size of the EC block.

13. A storage node, comprising:
a processor; and
a memory coupled to the processor, wherein the memory has a plurality of instructions stored thereon that, when executed by the processor, cause the processor to:
obtain to-be-written data and a key value of the to-be-written data;
update a version number corresponding to the key value;
perform erasure code (EC) encoding on the to-be-written data to generate an EC stripe, wherein the EC stripe comprises m+k EC blocks, wherein the m EC blocks are data blocks, wherein the k EC blocks are check blocks, wherein m is a positive integer greater than or equal to 2, and wherein k is a natural number;
equally divide a storage address of a logical volume at a granularity of the m EC blocks in order to obtain multiple storage units;
allocate data offset identifiers to the multiple storage units;
query a partition view and determine a secondary storage node corresponding to a partition to which the to-be-written data belongs, wherein the storage node is a primary storage node corresponding to the partition, and wherein a second storage node is one of secondary storage nodes corresponding to the partition;
send a write request to each secondary storage node, wherein the write request carries a partition ID of the partition to which the to-be-written data belongs, the key value and the version number of the to-be-written data, and data of an EC block allocated to each secondary storage node;
store data of an EC block allocated to the second storage node when determining that writing to the second storage node fails, and
generate metadata information corresponding to the EC block allocated to the second storage node, wherein the metadata information comprises the partition ID of the partition to which the to-be-written data belongs, and the key value and the version number of the to-be-written data; and
send, to the second storage node after the second storage node recovers from a fault, the stored data of the EC block allocated to the second storage node and the metadata information, so that the second storage node performs data reconstruction.

14. The storage node according to claim 13, wherein the instructions further cause the processor to determine that a quantity of storage nodes to which writing succeeds is greater than or equal to m.

15. The storage node according to claim 13, wherein the instructions further cause the processor to:
receive a data synchronization request sent by the second storage node, wherein the data synchronization request carries the partition ID;
obtain, from the second storage node, a key value corresponding to the partition ID and a version number of the key value that are recorded on the second storage node;
compare a key value corresponding to the partition ID and a version number of the key value that are recorded by the processor, with the key value corresponding to the partition ID and the version number of the key value that are obtained from the second storage node;
determine, according to a comparison result, that data reconstruction needs to be performed; and
send, according to the metadata information, stored data to the second storage node for data reconstruction, of an EC block corresponding to the key value, for which data reconstruction is needed and metadata information of the EC block.

16. The storage node according to claim 15, wherein the instructions further cause the processor to perform at least one of the following comparison processing:
skipping performing data reconstruction when the version number corresponding to the key value recorded on the storage node is the same as the version number corresponding to the key value obtained from the second storage node;
instructing the second storage node to delete data corresponding to the key value that is not comprised in the storage node when the key value recorded on the storage node does not comprise the key value obtained from the second storage node;
performing a data reconstruction operation when the version number corresponding to the key value recorded on the storage node is greater than the version number corresponding to the key value obtained from the second storage node; and
instructing the second storage node to reconstruct the data corresponding to the key value that is not comprised in the second storage node when the key value recorded on the storage node is not comprised in the key value obtained from the second storage node.

17. The storage node according to claim 13, wherein the instructions further cause the processor to allocate free storage space as a log volume in order to store an EC block allocated to a storage node to which writing fails, wherein the log volume includes at least one log block, and wherein a size of the log block is the same as a size of the EC block.

18. A distributed storage system, comprising:
a first storage node; and
a second storage node,
wherein the first storage node is configured to:
obtain to-be-written data and a key value of the to-be-written data;
update a version number corresponding to the key value;
perform erasure code (EC) encoding on the to-be-written data to generate an EC stripe,
wherein the EC stripe comprises m+k EC blocks,
wherein the m EC blocks are data blocks,
wherein the k EC blocks are check blocks, wherein m is a positive integer greater than or equal to 2, and wherein k is a natural number;
   calculate a hash value corresponding to the key value of the to-be-written data using a consistent hashing algorithm;
   determine a partition ID of a partition to which the hash value belongs;
   query a partition view;
   determine a secondary storage node corresponding to the partition to which the to-be-written data belongs, wherein the first storage node is a primary storage node corresponding to the partition, wherein the second storage node is one of secondary storage nodes corresponding to the partition;
   send a write request to each secondary storage node, wherein the write request carries a partition ID of the partition to which the to-be-written data belongs, the key value and the version number of the to-be-written data, and data of an EC block allocated to each secondary storage node;
   store data of an EC block allocated to the second storage node when writing to the second storage node fails;
   generate metadata information corresponding to the EC block allocated to the second storage node, wherein the metadata information comprises the partition ID of the partition to which the to-be-written data belongs, and the key value and the version number of the to-be-written data; and
   send, to the second storage node, the stored data of the EC block allocated to the second storage node and the metadata information after the second storage node recovers from a fault, and
wherein the second storage node is configured to write, according to the metadata information, the data of the EC block allocated to the second storage node.

* * * * *